United States Patent
Lin et al.

(10) Patent No.: US 7,655,941 B2
(45) Date of Patent: Feb. 2, 2010

(54) PHASE CHANGE MEMORY DEVICE AND METHOD FOR FABRICATING THE SAME

(75) Inventors: Yung-Fa Lin, Hsinchu (TW); Te-Chun Wang, Hsinchu (TW)

(73) Assignees: Industrial Technology Research Institute, Hsinchu (TW); Powerchip Semiconductor Corp., Hsin-Chu (TW); Nanya Technology Corporation, Taoyuan (TW); ProMOS Technologies, Inc., Hsinchu (TW); Winbond Electronics Corp., Hsinchu (TW)

( * ) Notice: Subject to any disclaimer, the term of this patent is extended or adjusted under 35 U.S.C. 154(b) by 5 days.

(21) Appl. No.: 11/940,563

(22) Filed: Nov. 15, 2007

(65) Prior Publication Data
US 2008/0290335 A1 Nov. 27, 2008

(30) Foreign Application Priority Data
May 21, 2007 (TW) ............... 96118040 A

(51) Int. Cl.
*H01L 47/00* (2006.01)

(52) U.S. Cl. ............ 257/4; 257/2; 257/5; 257/E29.276; 438/900; 365/100; 365/148; 338/13

(58) Field of Classification Search .................. None
See application file for complete search history.

(56) References Cited

U.S. PATENT DOCUMENTS

| | | | |
|---|---|---|---|
| 6,501,111 B1 | 12/2002 | Lowrey | |
| 7,135,727 B2 * | 11/2006 | Lee et al. | 257/296 |
| 2008/0191186 A1 * | 8/2008 | Lung et al. | 257/3 |

FOREIGN PATENT DOCUMENTS

| | | |
|---|---|---|
| CN | 1960020 (A) | 5/2007 |
| EP | 1339111 A1 | 8/2003 |

* cited by examiner

*Primary Examiner*—Evan Pert
*Assistant Examiner*—Scott R Wilson
(74) *Attorney, Agent, or Firm*—Quintero Law Office

(57) ABSTRACT

A phase change memory device comprising a substrate. A plurality of bottom electrodes isolated from each other is on the substrate. An insulating layer crosses a portion of the surfaces of any two of the adjacent bottom electrodes. A pair of phase change material spacers is on a pair of sidewalls of the insulating layer, wherein the pair of the phase change material spacers is on any two of the adjacent bottom electrodes, respectively. A top electrode is on the insulating layer and covers the phase change material spacers.

17 Claims, 9 Drawing Sheets

PHASE CHANGE MEMORY DEVICE AND METHOD FOR FABRICATING THE SAME

BACKGROUND OF THE INVENTION

1. Field of the Invention

The invention relates to a phase change memory device and method for fabricating the same, and more particularly to a phase change memory device with a relatively higher device density and a method for fabricating the same.

2. Description of the Related Art

A phase change memory (PCM) device may potentially serve as a 64-megabyte (MB) or greater stand-alone non-volatile memory, such as a flash memory. A PCM device stores data by changing the state of a phase change material from an amorphous state to crystalline state using a heating electrode. Before PCM devices become a mainstream replacement for flash memory, however, they must first achieve excellent electrical and thermal performance. Fabrication of non-volatile memory with relatively higher device density using conventional fabrication processes is, thus, a major aim of researchers.

U.S. Pat. No. 6,501,111 issued by Intel Corporation discloses a conventional three-dimensional PCM (3D-PCM) 212 with a cup-shaped bottom electrode 206 as shown in FIG. 1a. A contact area between a phase change material 207 and a bottom electrode can serve as a contact area between the phase change material 207 and a width of the cup-shaped bottom electrode 206, thus, device density is improved. However, a bottleneck occurs when minimizing the device area using conventional fabrication processes, thus, making the invention unsuitable for photolithography processes with critical dimensions (CD) below 0.1 μm. As shown in FIG. 1b, EP Pat. No. 1339111 issued by ST Microelectronics (STM) Corporation discloses a PCM formed by filling a phase change material into a contact hole 57 with a nano-level CD or a minitrench 58 to reduce the contact area 58 between the phase change material and a cup-shaped heating electrode 22, thus, achieving higher device density. However, if the CD of the contact hole is too small to be filled with phase change material, a seam problem occurs.

A PCM device with higher device density is desirable.

BRIEF SUMMARY OF INVENTION

A detailed description is given in the following embodiments with reference to the accompanying drawings.

The invention provides a phase change memory device and method for fabricating the same. An exemplary embodiment of a phase change memory device comprises a substrate. A plurality of bottom electrodes isolated from each other is on the substrate. An insulating layer crosses a portion of the surfaces of any two of the adjacent bottom electrodes. A pair of phase change material spacers is on a pair of sidewalls of the insulating layer, wherein the pair of phase change material spacers is on any two of the adjacent bottom electrodes, respectively. A top electrode is on the insulating layer and covers the phase change material spacers.

A method for fabricating a phase change memory device comprises providing a substrate having a plurality of bottom electrodes on the substrate, wherein the plurality of bottom electrodes are isolated from each other by a first insulating layer. A phase change material structure is formed on the first insulating layer, crossing a portion of the surfaces of any two of the adjacent bottom electrodes, wherein the phase change material structure comprises a pair of phase change material spacers electrically connected to any two of the adjacent bottom electrodes, respectively. A top electrode is formed on the insulating layer, electrically connecting the pair of phase change material spacers.

BRIEF DESCRIPTION OF DRAWINGS

The invention can be more fully understood by reading the subsequent detailed description and examples with references made to the accompanying drawings, wherein:

FIG. 8b shows cross sections taken along line B-B' of FIG. 8a.

DETAILED DESCRIPTION OF INVENTION

Figure 1A:
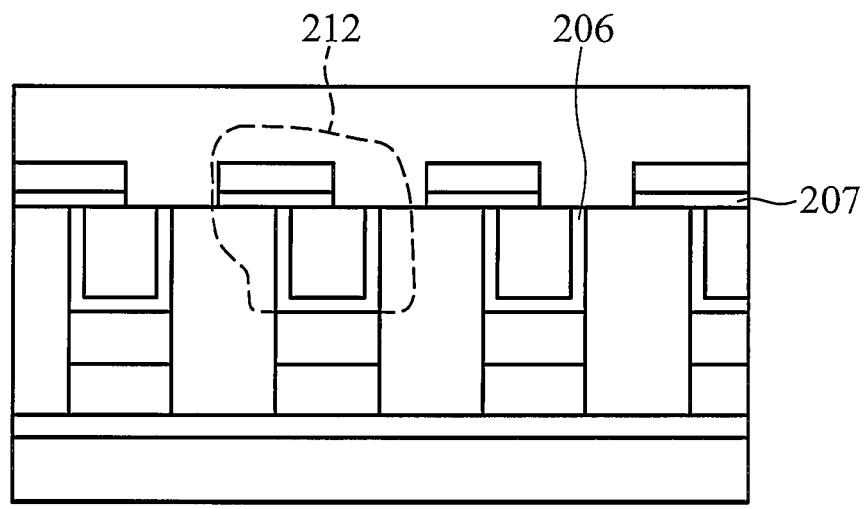
FIGS. 1a and 1b show conventional phase change memory devices.
Figure 1B:
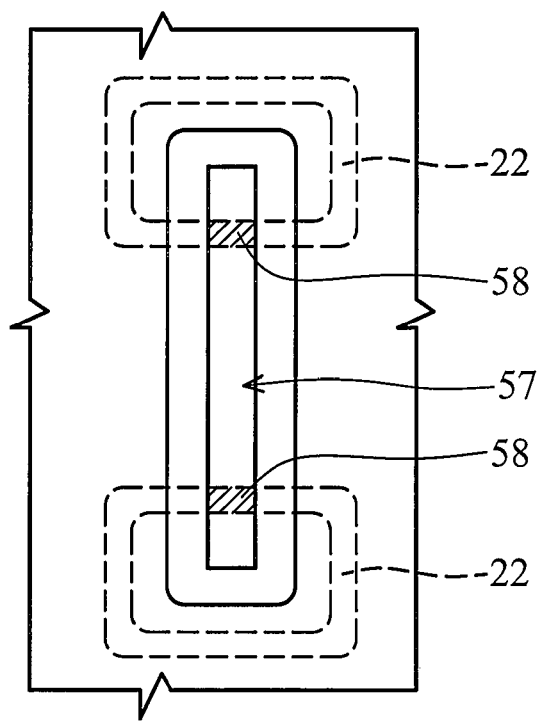

The following description is of a mode of carrying out the invention. This description is made for the purpose of illustrating the general principles of the invention and should not be taken in a limiting sense. The scope of the invention is best determined by reference to the appended claims.

FIGS. 2a, 3a, 4a, 5a, 6a, 7a, 8a and 9a show top views of an exemplary embodiment of a phase change memory device of the invention. For clarity, top views of four phase change memory devices are shown. FIGS. 2b, 3b, 4b, 5b, 6b, 7b and 9b are cross sections taken along line A-A' of FIGS. 2a, 3a, 4a, 5a, 6a, 7a and 9a, respectively. FIG. 8b shows cross sections taken along line B-B' of FIG. 8a. Wherever possible, the same reference numbers are used in the drawings and the descriptions of the same or like parts.

Figure 2A:
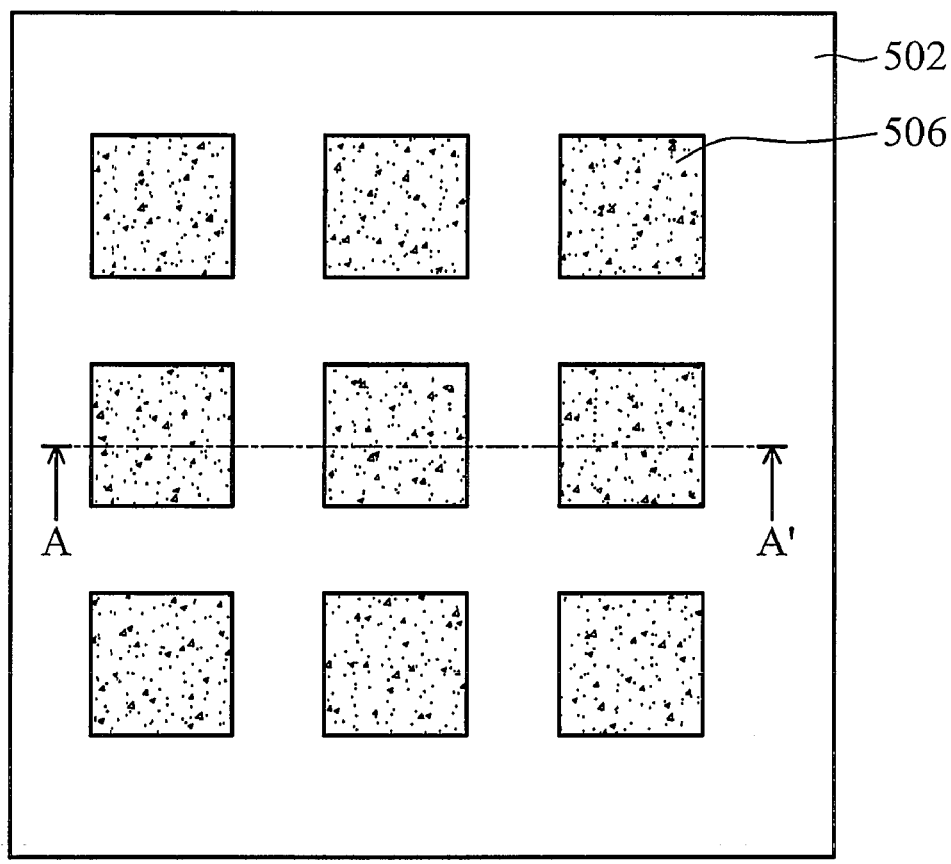
FIGS. 2a, 3a, 4a, 5a, 6a, 7a, 8a and 9a show top views of an exemplary embodiment of a phase change memory device.
Figure 2B:
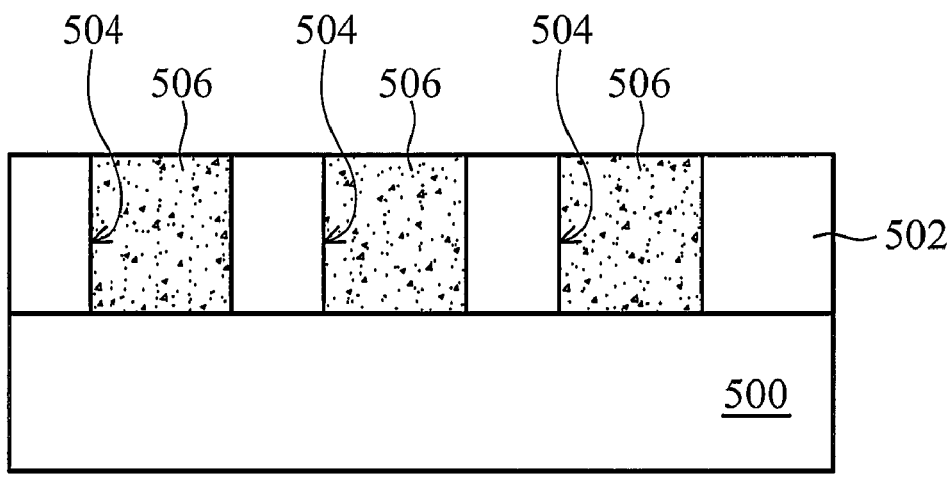
FIGS. 2b, 3b, 4b, 5b, 6b, 7b and 9b show cross sections taken along line A-A' of FIGS. 2a, 3a, 4a, 5a, 6a, 7a and 9a, respectively.

FIG. 2a illustrates a top view of an exemplary embodiment of a phase change memory device. FIG. 2b shows a cross section of the phase change memory device taken along line A-A' of FIG. 2a. A substrate 500 is provided. The substrate 500 may comprise silicon. In alternative embodiments, SiGe, bulk semiconductor, strained semiconductor, compound semiconductor, silicon on insulator (SOI), and other commonly used semiconductor substrates can be used for the substrate 500. The substrate 500 may also comprise a substrate having electronic components such as transistors, diodes, resistors, capacitors or inductors.

Next, a first insulating layer 502 is formed on the substrate 500 by thin film deposition such as chemical vapor deposition (CVD). The first insulating layer 502 may comprise silicon dioxide ($SiO_2$), silicon nitride ($Si_3N_4$) or the like. The first insulating layer 502 is then covered with a patterned photoresist to define the position of an opening 504, and subsequent anisotropic etching is next performed to remove the first insulating layer 502 not covered by the patterned photoresist until the substrate 500 is exposed. Next, the patterned photoresist is removed to form an opening 504. A conductive layer (not shown) is then blanketly formed over the entire region, filling in the opening 504 by a deposition process, such as, physical vapor deposition (PVD), sputtering, low pressure chemical vapor deposition (LPCVD), atomic layer chemical vapor deposition (ALD) or electroless plating. A planarizing process such as chemical mechanical polishing (CMP) is performed to remove the excess conductive layer to form a plurality of bottom electrodes 506, which are isolated from each other by the first insulating layer 502. The bottom electrodes 506 may comprise metals, alloys, metal compounds, semiconductor materials or combinations thereof. The bottom electrodes 506 may comprise basic metals or alloys thereof (such as Cu or Al), refractory metals or alloys thereof (such as Co, Ta, Ni, Ti, W or TiW), transition metal nitrides, refractory metal nitrides (such as CoN, TaN, NiN, TiN or WN), nitride metal silicides (such as $CoSi_xN_Y$, $TaSi_xN_Y$, $NiSi_xN_Y$, $TiSi_xN_Y$ or $WSi_xN_Y$), metal silicides (such as Co-salicide ($CoSi_x$), Ta-salicide ($TaSi_x$), Ni-salicide ($NiSi_x$), Ti-salicide ($TiSi_x$), W-salicide ($WSi_x$), polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. As shown in FIG. 2a, the bottom electrode 506 is rectangle from top view.

Figure 3A:
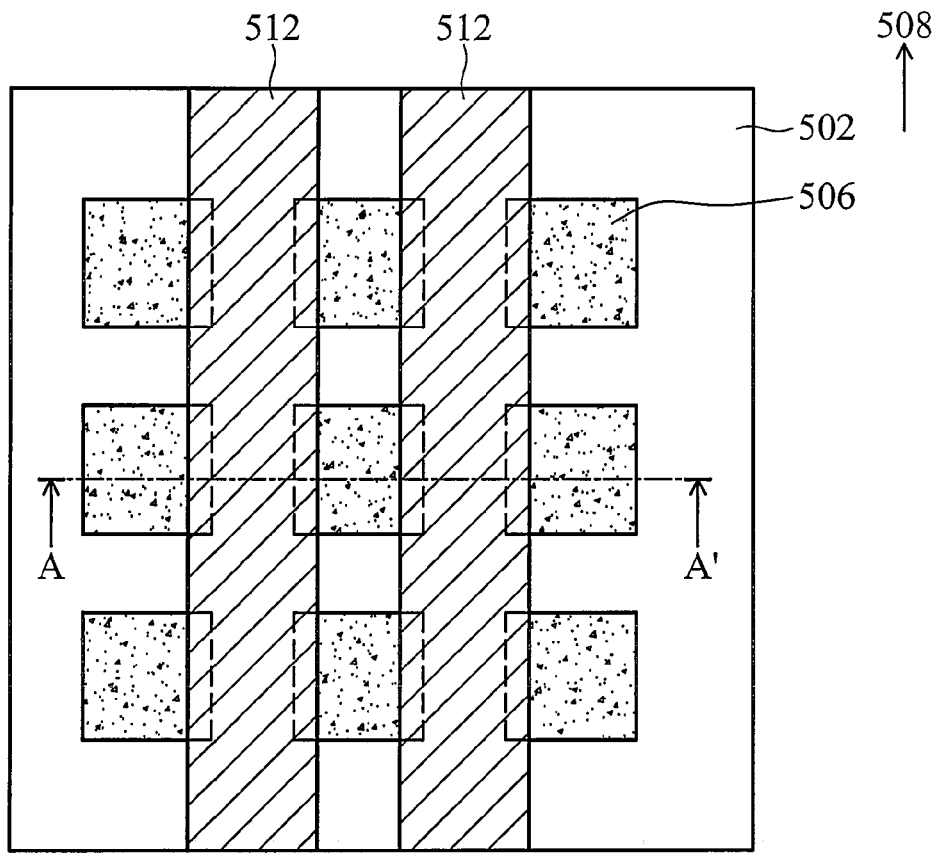
Figure 3B:
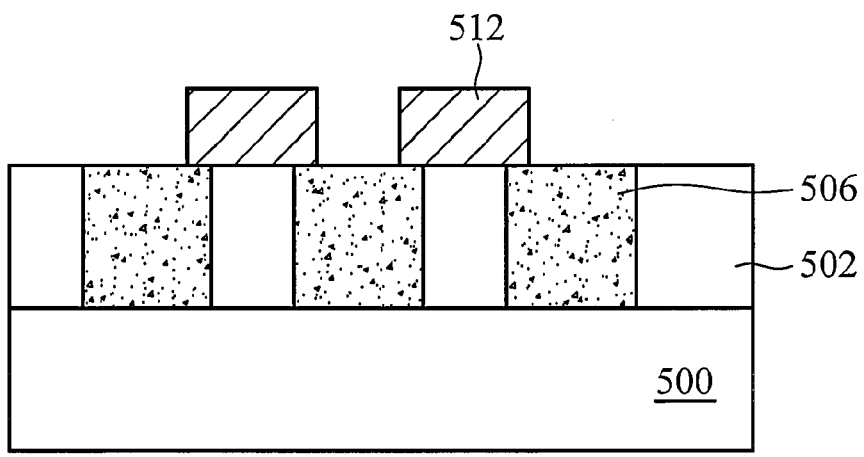

Referring to FIGS. 3a and 3b, a second insulating layer 512 is formed on the first insulating layer 502 along a first direction 508. An insulating layer such as silicon dioxide ($SiO_2$) or silicon nitride ($Si_3N_4$) is blanketly formed on the first insulating layer 502 and the bottom electrodes 506. Next, a patterned photoresist (not shown) is used to cover the insulating layer and to define the position of the second insulating layer 512. An anisotropic etching process is performed to remove the insulating layer not covered by the patterned photoresist. The patterned photoresist is then removed to form the strip-shaped second insulating layer 512. In one embodiment, two sidewalls of the second insulating layer 512 cross a portion of the surfaces of any two of the adjacent bottom electrodes 506 respectively.

Figure 4A:
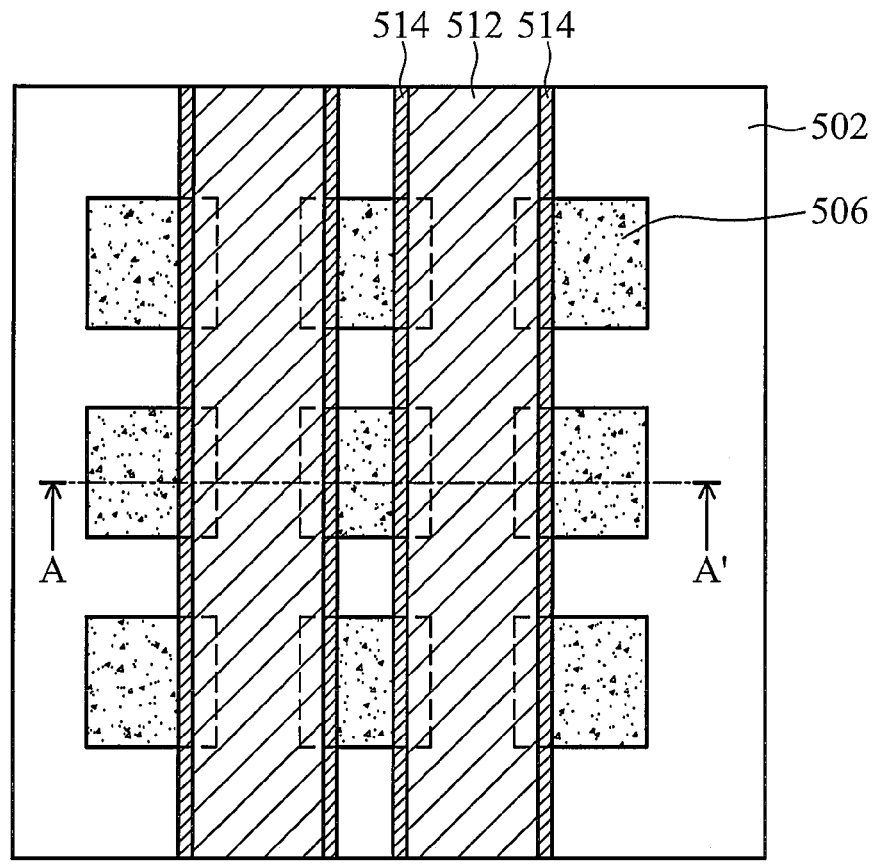
Figure 4B:
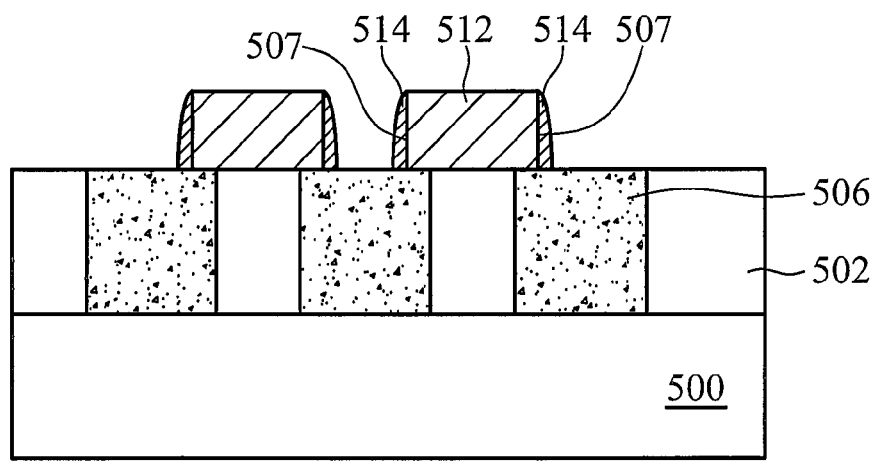

Referring to FIGS. 4a and 4b, a pair of phase change material spacers 514 are formed on a pair of sidewalls 507 of the second insulating layer 512. In one embodiment, a phase change material layer may be conformably formed on the first insulating layer 502, the bottom electrode 506 and the second insulating layer 512 by physical vapor deposition (PVD), thermal evaporation, pulsed laser deposition or metal organic chemical vapor deposition (MOCVD). Next, the phase change material layer on top of the first insulating layer 502, the bottom electrode 506 and the second insulating layer 512 is removed by anisotropic etching to form the phase change material spacers 514 on sidewalls 507 of the second insulating layer 512. The phase change material spacers 514 may comprise binary, ternary or tetra chalcogenide such as GaSb, GeTe, Ge—Sb—Te (GST) alloy, Ag—In—Sb—Te alloy or combination thereof.

Figure 5A:
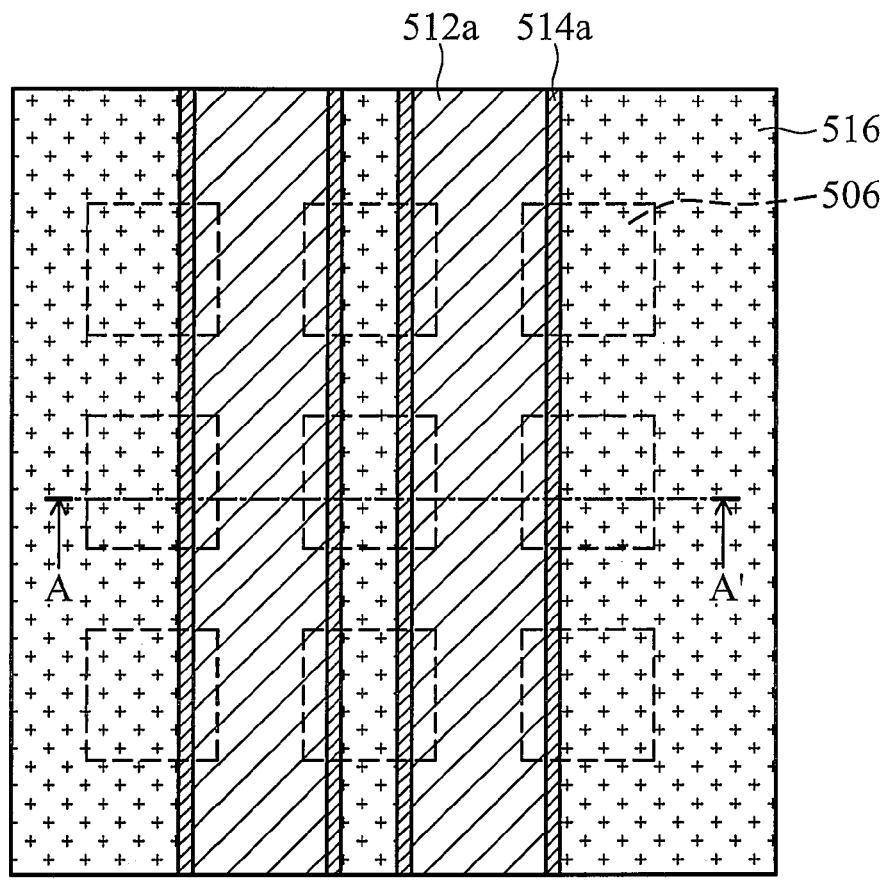
Figure 5B:
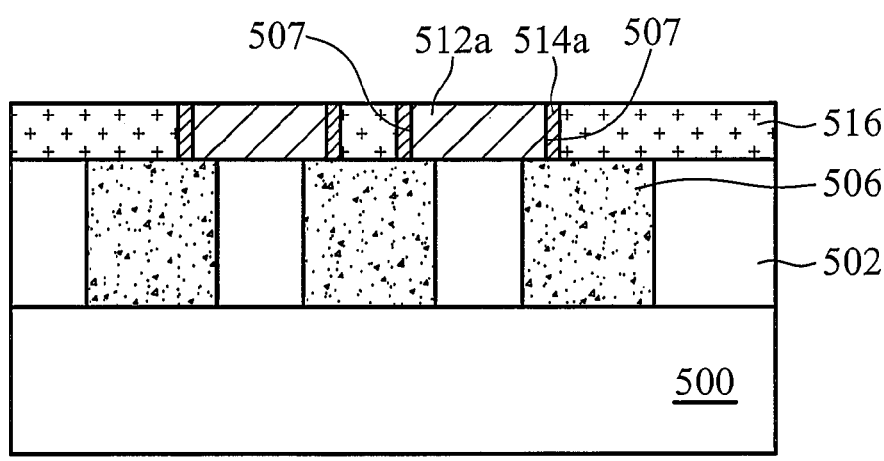

FIGS. 5a and 5b illustrate a formation of a third insulating layer 516. In one embodiment, a third dielectric layer 516 is blanketly deposited covering the second insulating layer 512 and the phase change material spacers 514. A planarizing process such as chemical mechanical polishing (CMP) is then performed to remove the excess third insulating layer 516 until the phase change material spacers 514 is exposed. And the second insulating layer 512a and the phase change material spacers 514a are thus formed. The third insulating layer 516 may comprise silicon dioxide ($SiO_2$), silicon nitride ($Si_3N_4$) or the like.

Figure 6A:
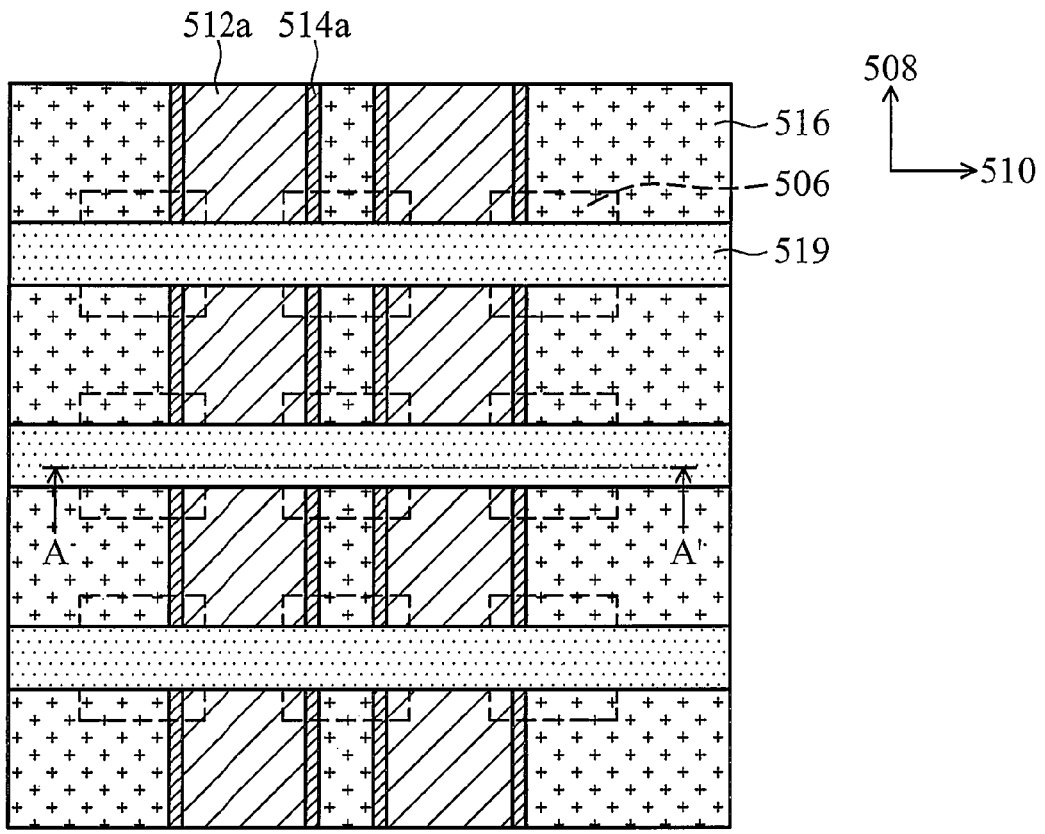
Figure 6B:
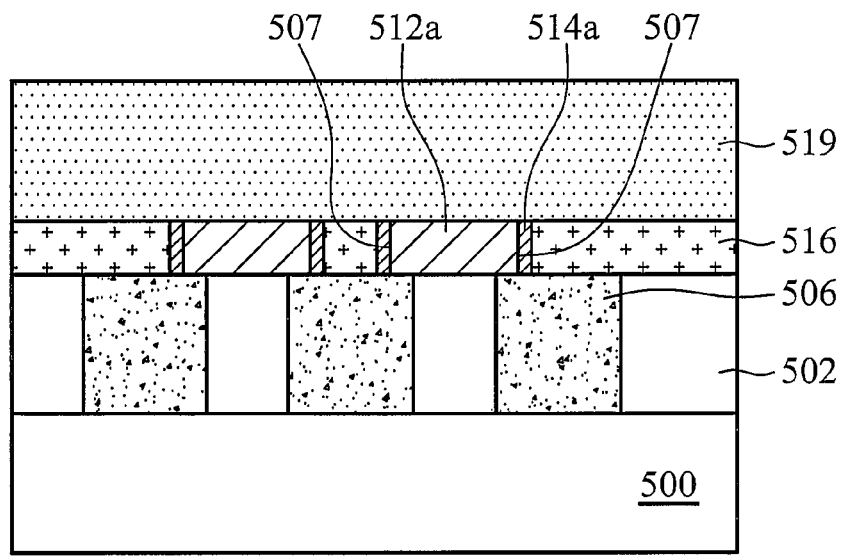

FIGS. 6a and 6b illustrate a formation of a patterned photoresist layer 519. A photoresist layer is blanketly formed over the entire region. Next, a patterned photoresist layer 519 is formed along a second direction 510 covering a portion of the second insulating layer 512a, the third insulating layer 516 and the pair of phase change material spacers 514a by photolithography process.

Figure 7A:
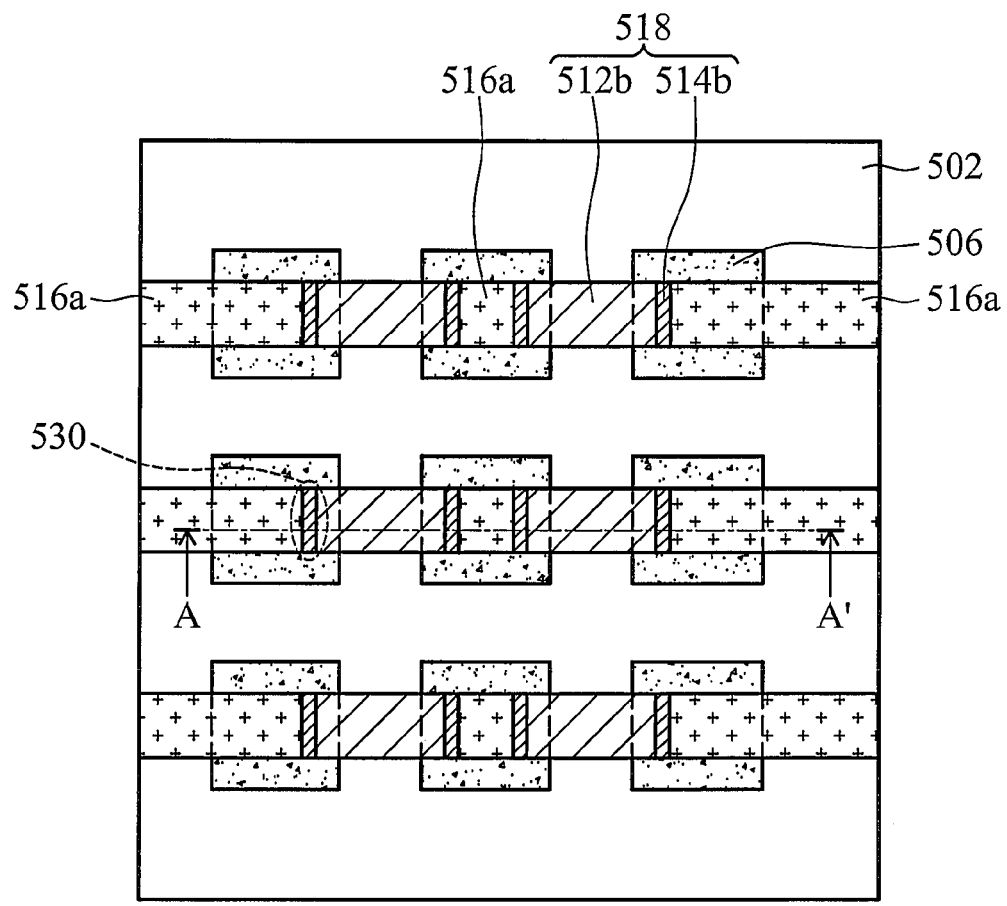
Figure 7B:
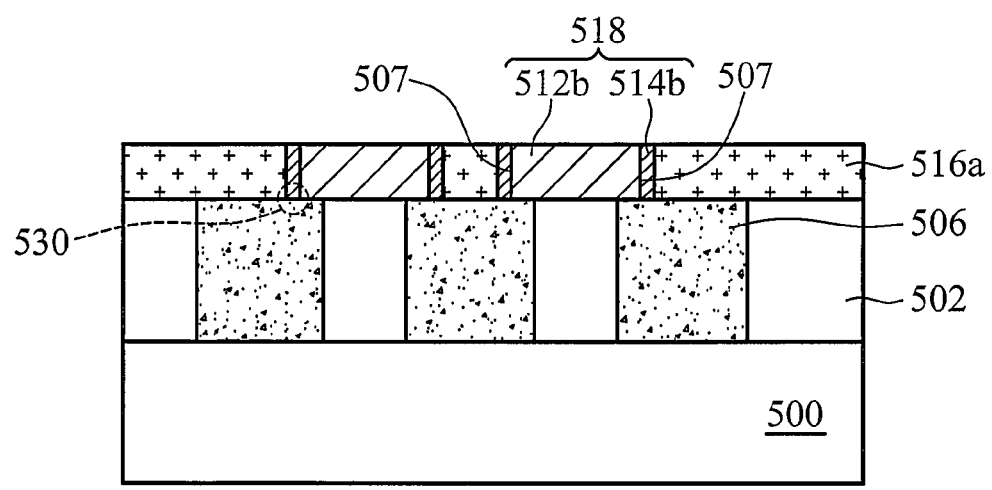

FIGS. 7a and 7b illustrate an embodiment of forming a phase change material structure 518. A portion of the second insulating layer 512a, the third insulating layer 516 and the pair of phase change material spacers 514a not covered by the patterned photoresist layer 519 are removed by anisotropic etching. Next, the patterned photoresist layer 519 is removed to form a third insulating layer 516a and a plurality of separating phase change material structures 518. The phase change material structure 518 comprises the second insulating layer 512b and the phase change material spacers 514b. As shown in FIGS. 7a and 7b, the second insulating layer 512b of the phase change material structure 518 crosses a portion of the surfaces of any two of the adjacent bottom electrodes 506. The pair of phase change material spacers 514b of the phase change material structure 518 is on any two of the adjacent bottom electrodes 506, respectively. A contact area 530 between the phase change spacer 514b and the bottom electrode 506 is smaller than an area of the bottom electrode 506. The contact area 530 of the phase change spacer 514b and the bottom electrode 506 is controlled by a thickness of the phase change spacer 514b or a width of the patterned photoresist layer 519. Thus the contact area of the heating electrode is smaller and more precisely controlled than that formed by a conventional photolithography process.

Figure 8A:
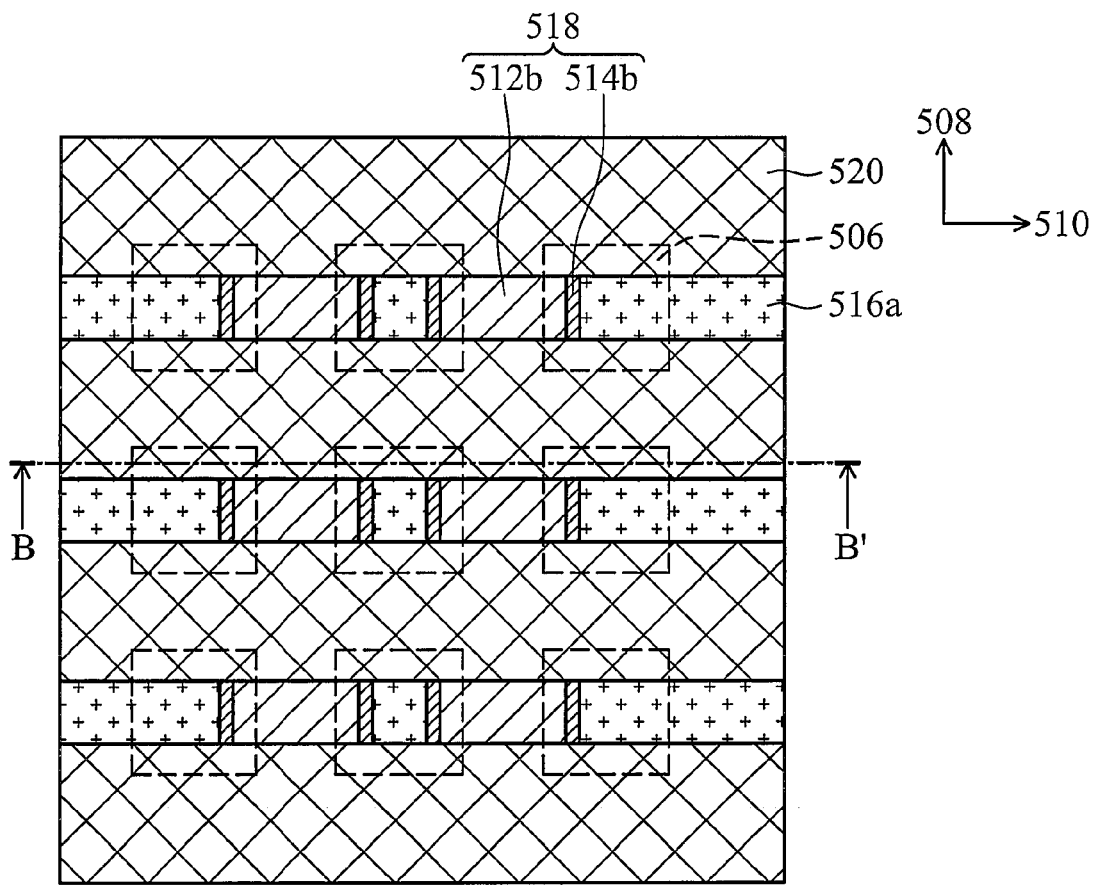
Figure 8B:
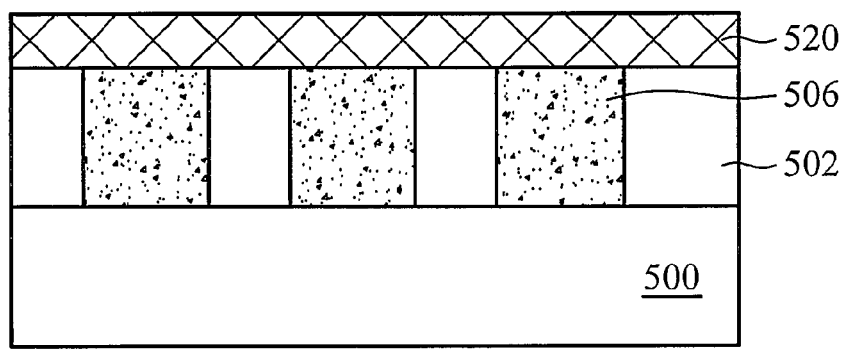

FIGS. 8a and 8b illustrate an embodiment of forming a fourth insulating layer 520. In one embodiment, a fourth insulating layer 520 is blanketly formed covering the phase change material structure 518. A planarizing process such as chemical mechanical polishing (CMP) is then performed to remove the excess fourth insulating layer 520 until the phase change material structure 518 is exposed. The fourth insulating layer 520 may comprise silicon dioxide ($SiO_2$), silicon nitride ($Si_3N_4$) or the like. In one embodiment, the first insulating layer 502, the second insulating layer 512b, the third insulating layer 516a and the fourth insulating layer 520 may comprise the same materials. As shown in FIGS. 8a and 8b, the phase change material structures 518 are isolated from each other. Each phase change material structures 518 viewed along the first direction 508 is isolated by the fourth insulating layer 520. Each phase change spacer 514b viewed along the second direction 510 is isolated by the second insulating layer 512b and the third insulating layer 516a. Therefore, storage status of any one of phase change spacer 514b can be changed without affecting another adjacent phase change spacer 514b. Misclassification of storage data can thus be avoided.

Figure 9A:
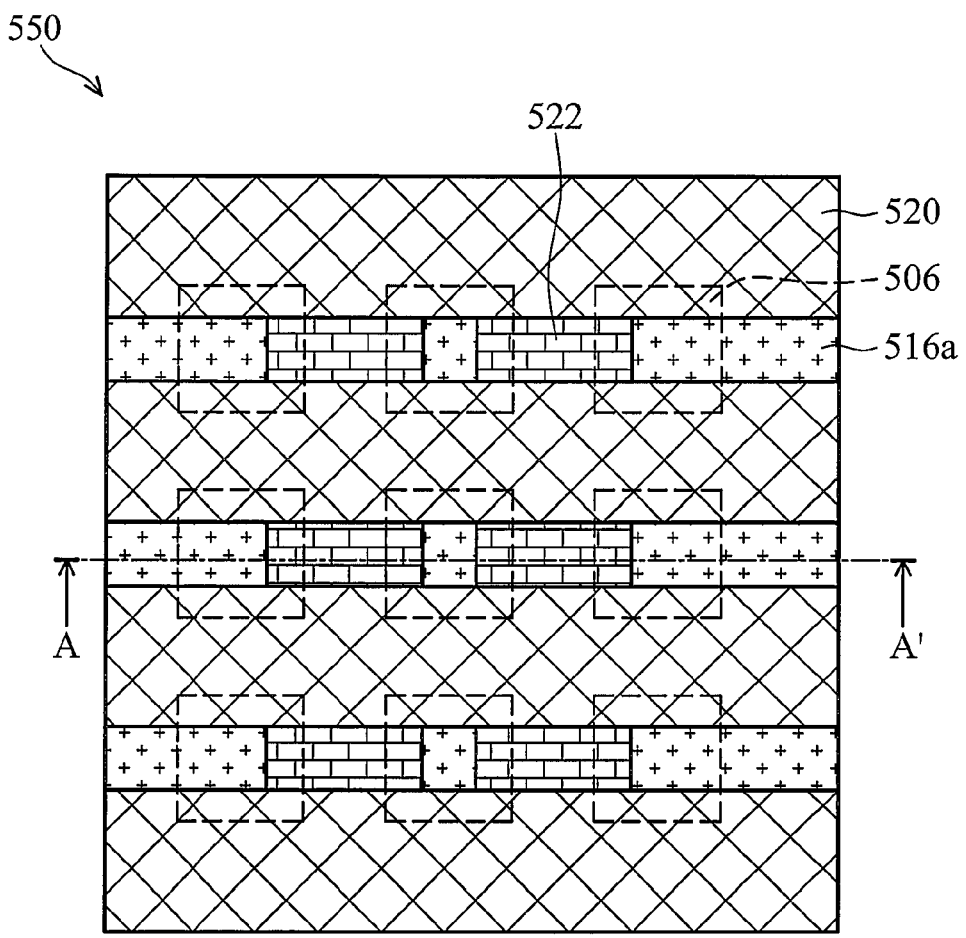
Figure 9B:
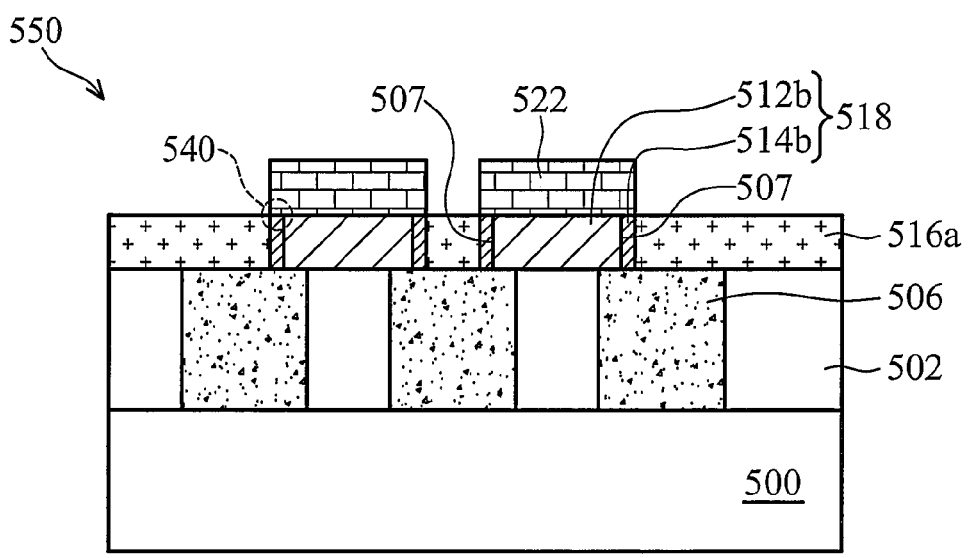

Referring to FIGS. 9a and 9b, a top electrode 522 is formed on the phase change material structures 518, electrically connecting the pair of phase change material spacers 514b. In one embodiment, a conductive layer may be blanketly formed over the entire region by a deposition process, such as, physical vapor deposition (PVD), sputtering, low pressure chemical vapor deposition (LPCVD), atomic layer chemical vapor deposition (ALD) or electroless plating. Next, the conductive layer is then covered with a patterned photoresist (not shown) to define the position of a top electrode 522, and subsequent anisotropic etching is next performed to remove the conductive layer not covered by the patterned photoresist. The patterned photoresist is then removed to form the top electrode 522. A contact area 540 between the phase change spacer 514b and the top electrode 522 is smaller than an area of the top electrode 522. The contact area 540 of the phase change spacer 514b and the top electrode 522 is controlled by a thickness of the phase change spacer 514b or a width of the patterned photoresist layer. Thus the contact area of the heating electrode can be smaller and more precisely controlled than that formed by a conventional photolithography process. The top electrode 522 may comprise metals, alloys, metal compounds, semiconductor materials or combinations thereof. The top electrode 522 may also comprise basic metals or alloys thereof (such as Cu or Al), refractory metals or alloys thereof (such as Co, Ta, Ni, Ti, W or TiW), transition metal nitrides, refractory metal nitrides (such as CoN, TaN, NiN, TiN or WN), nitride metal silicides (such as $CoSi_XN_Y$, $TaSi_XN_Y$, $NiSi_XN_Y$, $TiSi_XN_Y$ or $WSi_XN_Y$), metal silicides (such as Co-salicide ($CoSi_X$), Ta-salicide ($TaSi_X$), Ni-salicide ($NiSi_X$), Ti-salicide ($TiSi_X$), W-salicide ($WSi_X$), polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. One exemplary embodiment of a phase change memory device 550 is thus completely formed.

In one embodiment of the phase change memory device 550, each of the top electrodes 522 is electrically connected to the pair of phase change spacers 514b of the phase change material structures 518. The phase change spacers 514b of the phase change material structures 518 are electrically connected to any two of the adjacent bottom electrodes 506, respectively, wherein the bottom electrodes 506 and the top electrode 522 which are connected by the phase change spacer 514b construct a bit of the phase change memory device 550. Therefore, each phase change memory device 550 has two bits.

One exemplary embodiment of the phase change memory device 550 mainly comprises, a substrate 500, a plurality of bottom electrodes 506 isolated from each other on the substrate 500, and a phase change material structure 518 crossing a portion of the surfaces of any two of the adjacent bottom electrodes 506, wherein the phase change material structure 518 comprises, a second insulating layer 512b crossing a portion of the surfaces of any two of the adjacent bottom electrodes 506, a pair of phase change material spacers 514b on a pair of sidewalls 507 of the second insulating layer 512b, wherein the pair of phase change material spacers 514b are on any two of the adjacent bottom electrodes 506, respectively, and a top electrode 522 on the phase change material structure 518, covering the pair of phase change material spacers 514b.

Some advantages of an exemplary embodiment of the phase change memory device are described in the following. The contact area between the phase change spacer and the heating electrode is controlled by a thickness of the phase change spacer or a width of the patterned photoresist defining the phase change material structure. Thus, the contact area of the heating electrode is smaller and more precisely controlled than that formed by a conventional photolithography process. As a result, device area is reduced, and higher memory density is achieved. Additionally, the adjacent phase change structures are isolated by insulating layers. Therefore, storage status of any one of the phase change structures can be changed without affecting the adjacent phase change structures. Misclassification of storage data can thus be avoided. Compared to the heating electrode of a conventional phase change memory, an exemplary embodiment of the phase change spacer directly contacts with the bottom electrode and the top electrode to achieve requirement for self-heating. Reset current $I_{reset}$ (current for the phase change material to transform from a crystalline state into an amorphous state) and set current $I_{set}$ (current for the phase change material to transform from an amorphous state into a crystalline state) of the phase change memory are controlled by a thickness of the phase change spacer or a width of the patterned photoresist defining the phase change material structure. Thus, control over $I_{reset}$ and $I_{set}$ can meet variable device requirements. Lastly, a conventional fabricating process can be used for the phase change material device, such that integration with a conventional complementary metal-oxide-silicon transistor (CMOS transistor) can be accomplished without additional processes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory device, comprising:
    a substrate;
    a plurality of bottom electrodes isolated from each other on the substrate;
    a plurality of insulating layer patterns respectively crossing a portion of the surfaces of any two of the adjacent bottom electrodes;
    a plurality of pairs of phase change material spacers respectively on a plurality of pairs of sidewalls of the insulating layer patterns, wherein the each pair of phase change material spacers are on any two of the adjacent bottom electrodes respectively, wherein the two adjacent phase change material spacers, which are on the sidewalls of the different insulating layer patterns, on the same bottom electrode are not connected to each other; and
    a plurality of top electrodes on the insulating layer patterns, wherein the each top electrode covers one pair of the phase change material spacers.

2. The phase change memory device as claimed in claim 1, wherein the bottom electrode is rectangle from a top view.

3. The phase change memory device as claimed in claim 1, wherein the bottom electrode comprises metals, alloys, metal compounds, semiconductor materials or combinations thereof.

4. The phase change memory device as claimed in claim 1, wherein the top electrode comprises metals, alloys, metal compounds, semiconductor materials or combinations thereof.

5. The phase change memory device as claimed in claim 1, wherein the insulating layer patterns comprise silicon oxide, silicon nitride or combinations thereof.

6. The phase change memory device as claimed in claim 1, wherein a contact area between the phase change spacer and the bottom electrode is smaller than an area of the bottom electrode.

7. The phase change memory device as claimed in claim 1, wherein a contact area between the phase change spacer and the top electrode is smaller than an area of the top electrode.

8. A method of fabricating a phase change memory device, comprising:
    providing a substrate having a plurality of bottom electrodes on the substrate, wherein the plurality of bottom electrodes is isolated from each other by a first insulating layer;
    forming a plurality of phase change material structures on the first insulating layer, each of the phase change material structures crosses a portion of the surfaces of any two of the adjacent bottom electrodes, wherein each of the phase change material structures comprises a pair of phase change material spacers electrically connected to any two of the adjacent bottom electrodes respectively, wherein the two adjacent phase change material spacers, which are on the same bottom electrode, of the different phase change material structures are not connected to each other; and forming a plurality of top electrodes on the first insulating layer, wherein the each top electrode electrically connects one pair of the phase change material spacers.

9. The method of fabricating the phase change memory device as claimed in claim 8, further comprising:

forming a second insulating layer along a first direction on the first insulating layer;

conformably forming a phase change material layer covering the first insulating layer and the second insulating layer;

removing the phase change material layer on top of the first insulating layer and the second insulating layer by anisotropic etching to form a pair of phase change material spacers on a pair of sidewalls of the second insulating layer;

forming a third insulating layer covering the second insulating layer and the pair of phase change material spacers;

performing a planarization process to remove a portion of the third insulating layer until the pair of phase change material spacers are exposed;

forming a patterned photoresist layer along a second direction covering a portion of the second insulating layer, the third insulating layer and the pair of phase change material spacers;

removing portion of the second insulating layer, the third insulating layer and the pair of phase change material spacers not covered by the patterned photoresist layer; and removing the patterned photoresist layer.

10. The method of fabricating the phase change memory device as claimed in claim 8, further comprising:

forming a fourth insulating layer covering the phase change material structure; and performing a planarization process to remove a portion of the fourth insulating layer until the phase change material structure is exposed.

11. The method of fabricating the phase change memory device as claimed in claim 8, wherein the bottom electrode is rectangle from a top view.

12. The method of fabricating the phase change memory device as claimed in claim 10, wherein the first insulating layer, the second insulating layer, the third insulating layer and the fourth insulating layer comprise the same materials.

13. The method of fabricating the phase change memory device as claimed in claim 10, wherein the first insulating layer, the second insulating layer, the third insulating layer and the fourth insulating layer comprise silicon oxide, silicon nitride or combinations thereof.

14. The method of fabricating the phase change memory device as claimed in claim 8, wherein the bottom electrode comprises metals, alloys, metal compounds, semiconductor materials or combinations thereof.

15. The method of fabricating the phase change memory device as claimed in claim 8, wherein the top electrode comprises metals, alloys, metal compounds, semiconductor materials or combinations thereof.

16. The method of fabricating the phase change memory device as claimed in claim 8, wherein a contact area between the phase change spacer and the bottom electrode is smaller than an area of the bottom electrode.

17. The method of fabricating the phase change memory device as claimed in claim 8, wherein a contact area between the phase change spacer and the top electrode is smaller than an area of the top electrode.

* * * * *